(12) United States Patent
Hudait et al.

(10) Patent No.: US 7,429,747 B2
(45) Date of Patent: Sep. 30, 2008

(54) SB-BASED CMOS DEVICES

(75) Inventors: Mantu K. Hudait, Portland, OR (US);
Suman Datta, Beaverton, OR (US);
Jack T. Kavalieros, Portland, OR (US);
Mark L. Doczy, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/560,494

(22) Filed: Nov. 16, 2006

(65) Prior Publication Data
US 2008/0116485 A1    May 22, 2008

(51) Int. Cl.
*H01L 29/06* (2006.01)
*H01L 29/20* (2006.01)

(52) U.S. Cl. ............ 257/14; 257/E29.103; 257/E29.11; 257/E29.19; 257/E29.251; 257/E29.254; 257/615

(58) Field of Classification Search .................. 257/14, 257/E29.103, E29.11, E29.19, E29.251, E29.254
See application file for complete search history.

(56) References Cited

U.S. PATENT DOCUMENTS

| 5,144,378 A | 9/1992 | Hikosaka |
| 2007/0138565 A1* | 6/2007 | Datta et al. ................. 257/369 |

FOREIGN PATENT DOCUMENTS

| JP | 62-298181 A | 12/1987 |
| JP | 02-246342 A | 10/1990 |
| JP | 2003-53276 A | 10/2003 |

OTHER PUBLICATIONS

N.A. Papanicolaou. Sb-based HEMTs with InAlSb/InAs heterojunction. Electronics Letter. Sep. 12, 2005. vol. 41, No. 19.*
Written Opinion PCT/US2007/082897 dated Oct. 29, 2007.

* cited by examiner

*Primary Examiner*—George Fourson
*Assistant Examiner*—Phillip S Green
(74) *Attorney, Agent, or Firm*—Blakely, Sokoloff, Taylor & Zafman LLP

(57) ABSTRACT

A group III-V material CMOS device may have NMOS and PMOS portions that are substantially the same through several of their layers. This may make the CMOS device easy to make and prevent coefficient of thermal expansion mismatches between the NMOS and PMOS portions.

26 Claims, 9 Drawing Sheets

| NMOS QW Channel 118 | PMOS QW Channel 120 |
| --- | --- |
| NMOS Bottom Barrier 114 | PMOS Bottom Barrier 116 |
| InAlSb Buffer Layer 112 ||
| AlSb Buffer Layer 108 ||
| AlSb Nucleation Layer 104 ||
| Si Substrate 102 ||

Figure 7

| InAlSb Spacer Layer 122 | InAlSb Spacer Layer 124 |
| --- | --- |
| NMOS QW Channel 118 | PMOS QW Channel 120 |
| NMOS Bottom Barrier 114 | PMOS Bottom Barrier 116 |
| InAlSb Buffer Layer 112 ||
| AlSb Buffer Layer 108 ||
| AlSb Nucleation Layer 104 ||
| Si Substrate 102 ||

Figure 8

| InAlSb Spacer Layer 122/124 |
|---|
| NMOS/PMOS QW Channel 118/120 |
| NMOS/PMOS Bottom Barrier 114/116 |
| InAlSb Buffer Layer 112 |
| AlSb Buffer Layer 108 |
| AlSb Nucleation Layer 104 |
| Si Substrate 102 |

Figure 9

| NMOS δ-Doped Layer 126 | PMOS δ-Doped Layer 128 |
|---|---|
| InAlSb Spacer Layer 122 | InAlSb Spacer Layer 124 |
| NMOS QW Channel 118 | PMOS QW Channel 120 |
| NMOS Bottom Barrier 114 | PMOS Bottom Barrier 116 |
| InAlSb Buffer Layer 112 ||
| AlSb Buffer Layer 108 ||
| AlSb Nucleation Layer 104 ||
| Si Substrate 102 ||

Figure 10

| InAlSb Top Barrier 130 | InAlSb Top Barrier 132 |
|---|---|
| NMOS δ-Doped Layer 126 | PMOS δ-Doped Layer 128 |
| InAlSb Spacer Layer 122 | InAlSb Spacer Layer 124 |
| NMOS QW Channel 118 | PMOS QW Channel 120 |
| NMOS Bottom Barrier 114 | PMOS Bottom Barrier 116 |
| InAlSb Buffer Layer 112 ||
| AlSb Buffer Layer 108 ||
| AlSb Nucleation Layer 104 ||
| Si Substrate 102 ||

Figure 11

| NMOS S/D Layer 138 | PMOS S/D Layer 140 |
|---|---|
| InAlSb Top Barrier 130 | InAlSb Top Barrier 132 |
| NMOS δ-Doped Layer 126 | PMOS δ-Doped Layer 128 |
| InAlSb Spacer Layer 122 | InAlSb Spacer Layer 124 |
| NMOS QW Channel 118 | PMOS QW Channel 120 |
| NMOS Bottom Barrier 114 | PMOS Bottom Barrier 116 |
| InAlSb Buffer Layer 112 ||
| AlSb Buffer Layer 108 ||
| AlSb Nucleation Layer 104 ||
| Si Substrate 102 ||

SB-BASED CMOS DEVICES

BACKGROUND

Background of the Invention

Most integrated circuits today are based on silicon, a Group IV element of the Periodic Table. Compounds of Group III-V elements such as gallium arsenide (GaAs), indium antimonide (InSb), indium phosphide (InP), and indium gallium arsenide (InGaAs) are known to have far superior semiconductor properties than silicon, including higher electron mobility and saturation velocity. These materials may thus provide superior device performance.

BRIEF DESCRIPTION OF THE DRAWINGS

FIG. 7 is a cross-sectional side view that illustrates the NMOS and PMOS quantum well channel layers on the bottom barrier layers.

FIG. 8 is a cross-sectional side view that illustrates the NMOS and PMOS spacer layers on the quantum well channel layers.

FIG. 9 is a cross-sectional side view illustrates the nucleation layer through spacer layer as blanket layers rather than separate layers.

FIG. 10 is a cross-sectional side view that illustrates the NMOS and PMOS delta-doped layers on the spacer layers.

FIG. 11 is a cross-sectional side view that illustrates the NMOS and PMOS top barrier layers on the delta-doped layers.

FIG. 12 is a cross-sectional side view that illustrates the NMOS and PMOS source/drain layers on the top barrier layers.

DETAILED DESCRIPTION

In various embodiments, an apparatus and method relating to the formation of a group III-V material semiconductor device are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
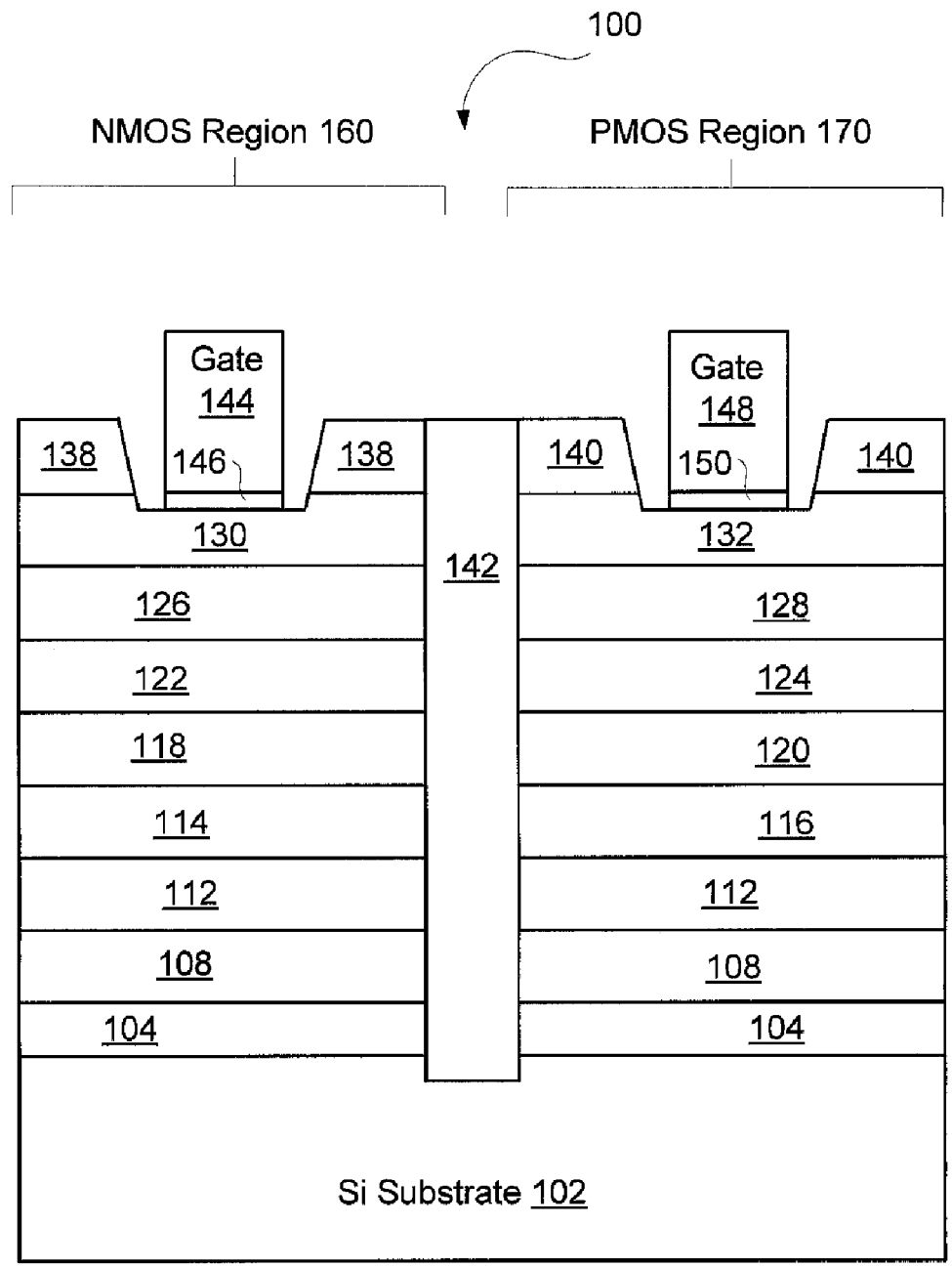
FIG. 1 is a cross sectional side view that illustrates a group III-V material CMOS device.

FIG. 1 is a cross sectional side view that illustrates a group III-V material CMOS device 100 according to one embodiment of the present invention. The CMOS device 100 includes an NMOS portion 160 with an NMOS device such as a transistor and a PMOS portion 170 with a PMOS device such as a transistor. There is a trench isolation 142 between the NMOS portion 160 and PMOS portion 170 that isolates the NMOS device from the PMOS device.

In this embodiment, the device 100 includes a silicon substrate 102. On the substrate 102 is an aluminium antimonide (AlSb) nucleation layer 104. On the nucleation layer 104 is an aluminium antimonide (AlSb) buffer layer 108, which may be referred to as the first buffer layer 108. On the buffer layer 108 is an indium aluminium antimonide (InAlSb) buffer layer 112, which may be referred to as the second buffer layer 112. The nucleation layer 104 is formed at the same time from the same materials in both the NMOS portion 160 and PMOS portion 170 of the device 100, which simplifies device 100 fabrication. Similarly, the first buffer layer 108 is formed at the same time from the same materials in both the NMOS portion 160 and PMOS portion 170 of the device 100, and second buffer layer 112 is formed at the same time from the same materials in both the NMOS portion 160 and PMOS portion 170 of the device 100. Because the NMOS portion 160 and PMOS portion 170 are substantially identical up through the second buffer layer 112, the device 100 is easier to make and does not have mismatched coefficient of thermal expansion problems that may be found in group III-V devices that have different materials on the N- and P-MOS portions.

In an embodiment, the III-V nucleation layer 104 is formed on a vicinal (offcut) surface of high-resistivity p-type or n-type Si substrate 102 having regular arrays of double-stepped (100) terraces across the substrate surface. A vicinal surface is a higher order crystal plane of the Si substrate 102, such as, but not limited to the (211), (511), (013), and (711) planes. A vicinal substrate surface having double-stepped terraces is capable of suppressing anti-phase domains (APD) in the first III-V buffer layer 108. An APD is created when a first polar crystal domain of a layer having group III atoms attached to the nonpolar silicon substrate 102 surface meets a second polar crystal domain of a layer having group V atoms attached to the silicon substrate 102. A crystal discontinuity may form in the layer at the border between these first and second domains providing recombination-generation centers that may be detrimental to the operation of a semiconductor device. The term "polar" refers to the partially ionic bonding character between the constituents of an III-V compound semiconductor.

There is a NMOS bottom barrier layer 114 on the second buffer layer 112 in the NMOS portion 160 and a PMOS bottom barrier layer 116 on the second buffer layer 112 in the NMOS portion 170. In the illustrated embodiment, the NMOS and PMOS bottom barrier layers 114, 116 are formed at the same time from the same materials in both the NMOS portion 160 and PMOS portion 170. Both the NMOS and PMOS bottom barrier layers 114, 116 are indium aluminium antimonide (InAlSb) layers. In other embodiments, the NMOS and PMOS bottom barrier layers 114, 116 may be formed at different times and/or from different materials. In one embodiment, the bottom barrier 116 is aluminium gallium antimonide ($Al_xGa_{1-x}Sb$, x=0.2-1.0). In some embodiments the lower barrier layer 114 comprises between about 10% and 100% aluminium, ($Al_xIn_{1-x}Sb$, with x=0.1-1.0). In a particular embodiment, the lower barrier layer 114 is $Al_xIn_{1-x}Sb$ with 15% aluminium ($Al_{0.15}In_{0.85}Sb$). In another embodiment, the PMOS bottom barrier layer 116 may comprise AlSb with essentially no In present. The second buffer layer 112 may comprise the same materials and compositions as the bottom barrier layer 114/116 in some embodiments.

There is a NMOS quantum well 118 on the NMOS bottom barrier layer 114 in the NMOS portion 160 and a PMOS quantum well 120 on the PMOS bottom barrier layer 116 in the NMOS portion 170. In the illustrated embodiment, the NMOS and PMOS quantum wells 118, 120 are formed at the same time from the same materials in both the NMOS portion 160 and PMOS portion 170. Both the NMOS and PMOS quantum wells 118, 120 are indium antimonide (InSb) layers in one embodiment. In other embodiments, the NMOS and PMOS quantum wells 118, 120 may be formed at different times and/or from different materials, to provide improved performance of the PMOS device. In another embodiment, PMOS quantum well layer 120 comprises indium gallium antimonide ($In_xGa_{1-x}Sb$, x=0.1-1).

Quantum wells 118 and 120 may be of sufficient thickness to provide adequate channel conductance. In a particular embodiment, the thickness of the quantum wells 118, 120 is between about 10 nm and about 50 nm. In certain embodiments quantum well layer 118, 120 is below a critical thickness that would introduce additional defects due to lattice mismatch. The quantum well layer 118, 120 may be strained by the lower barrier layers 114, 116, the top barrier layer 122, 124, or both.

In one embodiment, the III-V buffer layer 108 has lattice spacing larger than the silicon substrate 102 and the III-V quantum well (QW) layer 118/120 has a lattice spacing larger than the III-V buffer layer 108. In another embodiment, nucleation layer 104 comprises gallium antimonide (GaSb) and buffer layer 108 comprises AlSb formed between the silicon substrate 102 and QW layer 118/120. In another embodiment, the lattice constant of the buffer materials 108 may be gradually incremented from the lattice spacing of the silicon substrate 102 to the lattice spacing of the QW device layer 118/120.

It should be appreciated that various III-V device layers may be similarly integrated with Si substrates using other III-V buffer architectures. For example, in another embodiment of the present invention, nucleation layer 104 and buffer layer 108 comprises composite structures with gallium arsenide (GaAs) and AlSb, formed between the silicon substrate 102 and the QW device layer 118/120. The selection of buffer layers may be based on the larger bandgap materials for the device isolation.

There is an NMOS spacer layer 122 on the NMOS quantum well 118 in the NMOS portion 160 and a PMOS spacer layer 124 on the PMOS quantum well 120 in the NMOS portion 170. In the illustrated embodiment, the NMOS and PMOS spacer layers 122, 124 are formed at the same time from the same materials in both the NMOS portion 160 and PMOS portion 170. Both the NMOS and PMOS spacer layers 122, 124 are indium aluminium antimonide (InAlSb) layers. In other embodiments, the NMOS and PMOS spacer layers 122, 124 may be formed at different times and/or from different materials. In the illustrated embodiment, the NMOS and PMOS portions 160, 170 are substantially the same through the spacer layers 122, 124, meaning formation the spacer layers 122, 124 and layers below the spacer layers 122, 124 is simple and without CTE problems, compared to devices 100 in which the NMOS portion 160 is different than the PMOS portion 170.

In a particular embodiment, NMOS quantum well 118 is InSb and spacer layer 122 is InAlSb, and PMOS quantum well 120 is InGaSb and spacer layer 124 is AlGaSb. An amount of compressive strain may be inside the NMOS and PMOS quantum wells 118, 120, depending on the materials and composition of the barrier layers 114, 116, and spacer layers 122, 124. Additionally, the amount of strain induced in the quantum well layers 118/120 may be tailored by controlling the thickness and lattice mismatch with the lower barrier layers 114, 116 and the spacer layers 122, 124. In a specific embodiment, wherein the quantum well 118 is InSb and the lower barrier layer 114, top barrier layer 130, and spacer layer 122 comprise $Al_xIn_{1-x}Sb$ with 15% aluminum, the quantum well layer 118 is compressively strained. For example, the strain between the NMOS quantum well 118, InSb and barrier layer of $In_xA_{1-x}Sb$ is depending on the aluminium inside the $In_xAl_{1-x}Sb$ layer. Higher amounts of Al may result in higher compressive strain inside the InSb quantum well 118. For PMOS 170 and given composition of barrier layer composition $Ga_{0.3}Al_{0.7}Sb$, compressive strain can be changed by changing the amount of indium in the $In_xGa_{1-x}Sb$ quantum well 120 material.

There is an NMOS delta-doped layer 126 on the NMOS spacer layer 122 in the NMOS portion 160 and a PMOS delta-doped layer 128 on the PMOS spacer layer 124 in the NMOS portion 170. The NMOS delta-doped layer 126 is doped with tellurium. The PMOS delta-doped layer 128 is doped with beryllium.

There is an NMOS top barrier layer 130 on the NMOS delta-doped layer 126 and a PMOS top barrier layer 132 on the PMOS delta-doped layer 128. In the illustrated embodiment, the NMOS and PMOS top barrier layers 130, 132 are formed at the same time from the same materials in both the NMOS portion 160 and PMOS portion 170. Both the NMOS and PMOS top barrier layers 130, 132 are indium aluminium antimonide (InAlSb) layers. In other embodiments, the NMOS and PMOS top barrier layers 130, 132 may be formed at different times and/or from different materials. In some embodiments, the NMOS bottom barrier layer 114, spacer layer 122, and top barrier layer 130 consist substantially of the same materials, and the PMOS bottom barrier layer 116, spacer layer 124, and top barrier layer 132 consist substantially of the same materials (although the PMOS layers may be different than the NMOS layers). For example, in an embodiment the NMOS quantum well 118 comprises InSb and the NMOS bottom barrier layer 114, spacer layer 122, and top barrier layer 130 comprise $In_{0.8}Al_{0.2}Sb$.

The device on the NMOS portion 160 also has an NMOS source and drain layer 138, a gate dielectric layer 146, and a gate 144. Similarly, the device on the PMOS portion 170 also has a PMOS source and drain layer 140, a gate dielectric layer 150, and a gate 148. As pictured, these devices are recessed-gate devices, but other types of devices may be used instead.

Figure 2:
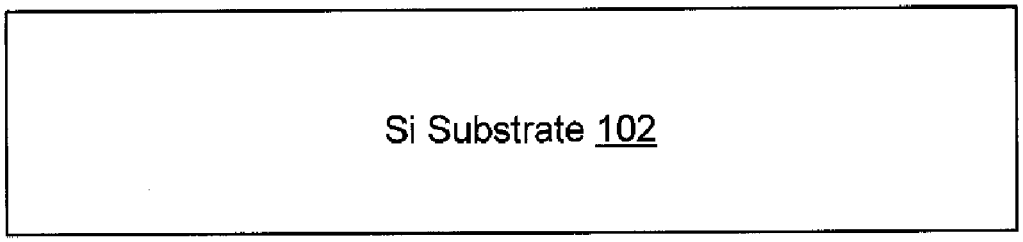
FIG. 2 is a cross-sectional side view that illustrates the substrate.

FIG. 2 is a cross-sectional side view that illustrates the substrate 102, according to one embodiment of the present invention. In the illustrated embodiment, the substrate 102 comprises a high-resistivity p-type or n-type vicinal silicon material. A vicinal surface may be prepared by offcutting the substrate 102 from an ingot. In a particular embodiment, the (100) substrate surface is offcut at an angle between 2 and 12 degrees towards the [110] direction. A vicinal surface is a higher order crystal plane of the silicon substrate 102, such as, but not limited to the (211), (511), (013), (711) planes. A vicinal substrate surface having double-stepped terraces is capable of suppressing anti-phase domains (APD) in the first III-V buffer layer 108. The high resistivity is achieved by a low dopant concentration, lower than about $10^{16}$ carriers/$cm^3$. In other embodiments, other materials could be used. For example, the substrate 102 could comprise germanium, could be a silicon-on-insulator substrate 102, could comprise gallium arsenide (GaAs), or could comprise another material.

Figure 3:
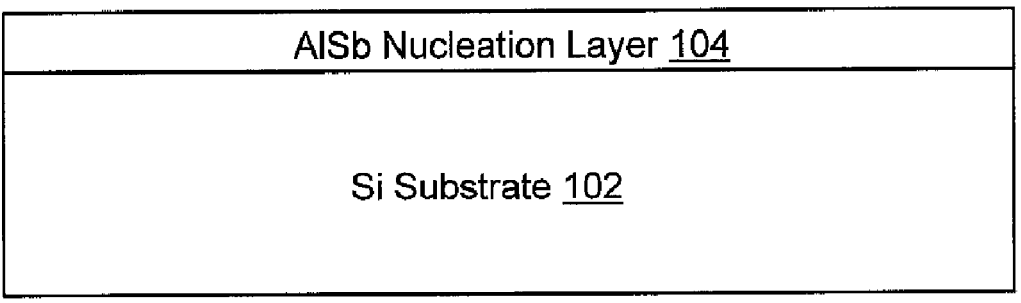
FIG. 3 is a cross-sectional side view that illustrates the nucleation layer on the substrate.

FIG. 3 is a cross-sectional side view that illustrates the nucleation layer 104 on the substrate 102, according to one embodiment of the present invention. In the illustrated embodiment, the nucleation layer 104 comprises stiochiometric aluminium antimonide (AlSb). It is formed by molecular beam epitaxy (MBE). It has a thickness of between about 100 A and about 500 A. In other embodiments, GaSb or GaAs nucleation layer 104 is grown to a thickness of between 100 A and 500 A. In an alternative embodiment, other suitable nucleation layers 104 may be used.

The first layer of the buffer 108 may be formed in a manner that avoids antiphase domains (APD) in the buffer film. The nucleation layer 104 may help prevent this. A nucleation layer 104 may be formed using migration enhanced epitaxy (MEE) at a temperature of between 300 C and 600 C. MEE proceeds in a fashion similar to that of atomic layer deposition (ALD). MEE has a relatively slower growth rate, approximately 0.1 um/hr, because once the group V element is introduced to the substrate 102 there is a hold time during which both the group V source and group III source shutters are closed (shuttered). This hold time accommodates the relatively lower mobility of the group V species. No hold time is required for group III species because surface migration of this species relatively higher mobility. In a particular MEE embodiment, the substrate 102 surface is exposed to an antimony (Sb) source for approximately 10 seconds to form a monolayer of Sb on the lowest terrace level. The Sb source and is then shuttered for a hold time of approximately 60 seconds. This relatively long hold time allows for the Sb species to migrate on the surface of the silicon substrate 102 to ensure the bonding sites of the lowest terrace level are filled. Then, the substrate 102 surface is exposed to either a gallium (Ga) or aluminium (Al) source for approximately 10 seconds. No hold time is required because of the high surface mobility of Ga or Al. Next, the Sb is reopened for approximately 10 second and then again closed for a hold time. This process is repeated to form either a GaSb or AlSb nucleation layer 104 sufficiently thick to fill all the terraces of the silicon substrate 102, approximately 150A in a particular embodiment. In an embodiment, AlSb nucleation temperatures are in between 300 C and 600 C. In particular AlSb embodiment, the MEE growth temperature is between approximately 400 C and approximately 570 C. Higher temperature embodiments may enable a higher quality film. In other embodiments, MEE can be utilized to form a nucleation layer 104 of an alternate buffer material, such as, but not limited to GaAs or GaSb.

In yet another embodiment, a nucleation layer 104 is formed on the vicinal silicon substrate 102 utilizing traditional MBE (without migration enhancement). The relatively higher flux of this particular embodiment using traditional MBE provides higher film growth rates and therefore higher throughput than MEE embodiments. In a particular MBE nucleation embodiment, AlSb is formed on the silicon substrate 102 at a temperature between approximately 400 C and approximately 570 C. The high-flux embodiments are well suited to AlSb because of the relatively low vapor pressure and high sticking coefficient of antimony (Sb) as compared to arsenic (As) of GaAs films. In other embodiments, a nucleation layer 104 of an alternate buffer material, such as, but not limited to GaAs or GaSb is formed.

Figure 4:
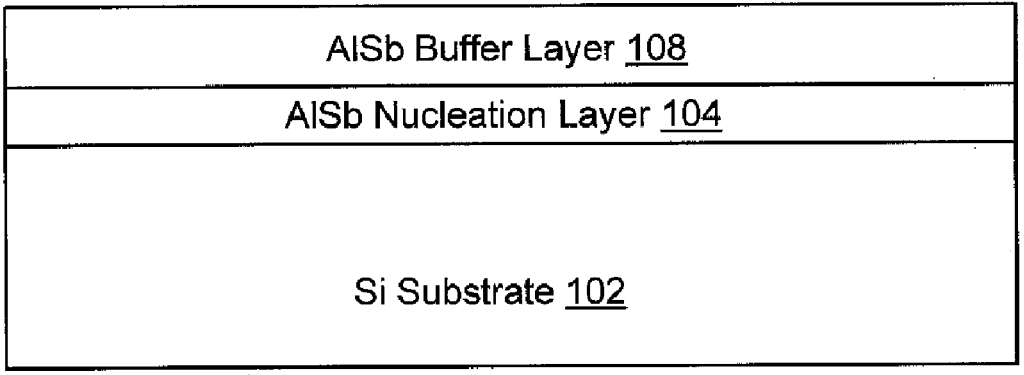
FIG. 4 is a cross-sectional side view that illustrates the first buffer layer on the nucleation layer.

FIG. 4 is a cross-sectional side view that illustrates the first buffer layer 108 on the nucleation layer 104, according to one embodiment of the present invention. In the illustrated embodiment, the first buffer layer 108 comprises aluminium antimonide (AlSb). It has a thickness between about 1 and 5 microns. In other embodiments, it may have sufficient thickness that most defects present at its bottom surface have been reduced to a desired amount at its top surface. Any suitable method may be used to form the first buffer layer 108.

This growth of the first buffer layer 108 may be performed at a higher temperature than that used for the nucleation layer 104. While first buffer layer 108 may considered and is shown as a separate layer from nucleation layer 104, both layers 104, 108 may be considered buffers, with layer 108 thickening the III-V buffer layer started by nucleation layer 104, and gliding dislocations. The film quality of layer 108 may be superior to that of the nucleation layer 104 because it is formed at a higher growth temperature. Also, during the formation of layer 108, the flux rate can be relatively high because the polar nucleation layer 104 may eliminate danger of APD formation. In an embodiment, AlSb film 108 is grown upon either a GaSb or AlSb nucleation layer 104 at a growth temperature in the range of 500 C. and 700 C. In a particular embodiment, AlSb film 108 is grown upon a GaSb nucleation layer 104 at a growth temperature between approximately 510 C and approximately 570 C.

In still another embodiment, the III-V buffer layer 108 is formed on a traditional silicon substrate 102 having a lower order plane surface, such as, but not limited to (100), without use of nucleation layer 104. The III-V buffer layer 108 is grown without a nucleation step and permitted to formed anti-phase domains. In an embodiment, the single-step growth is performed at a temperature between 500 C. and 700 C. Once the film thickness is greater than approximately 1.5 um, the anti-phase domains are substantially annihilated and the buffer layer 108 becomes single-domain. In a particular embodiment, III-V buffer layer 108 comprising between approximately 1.5 and 2.0 um AlSb is formed on a traditional (100) silicon substrate 102 that has a 0 degree offcut.

Figure 5:
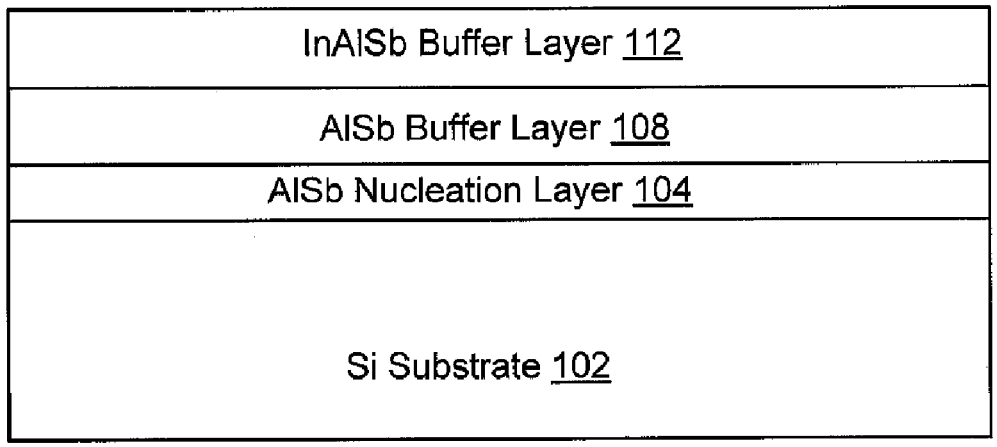
FIG. 5 is a cross-sectional side view that illustrates the second buffer layer on the first buffer layer.

FIG. 5 is a cross-sectional side view that illustrates the second buffer layer 112 on the first buffer layer 108, according to one embodiment of the present invention. In the illustrated embodiment, the second buffer layer 112 comprises indium aluminium antimonide ($In_{1-x}Al_xSb$: x=0.1-1.0). It has a thickness between about 1 and 5 microns. In other embodiments, it may have sufficient thickness that most defects present at its bottom surface are not present at its top surface. Any suitable method may be used to form the second buffer layer 112.

As described above with respect to FIG. 1, in the illustrated embodiment the NMOS and PMOS portions 160, 170 are substantially identical at this stage of fabrication. Each of the nucleation layer 104, first buffer layer 108, and second buffer layer 112 is formed as a blanket layer over both the NMOS and PMOS portions 160, 170. Thus, the formation of the structure shown in FIG. 5 is relatively simple, and has no coefficient of thermal expansion (CTE) mismatches between the NMOS and PMOS portions 160, 170.

Figure 6:
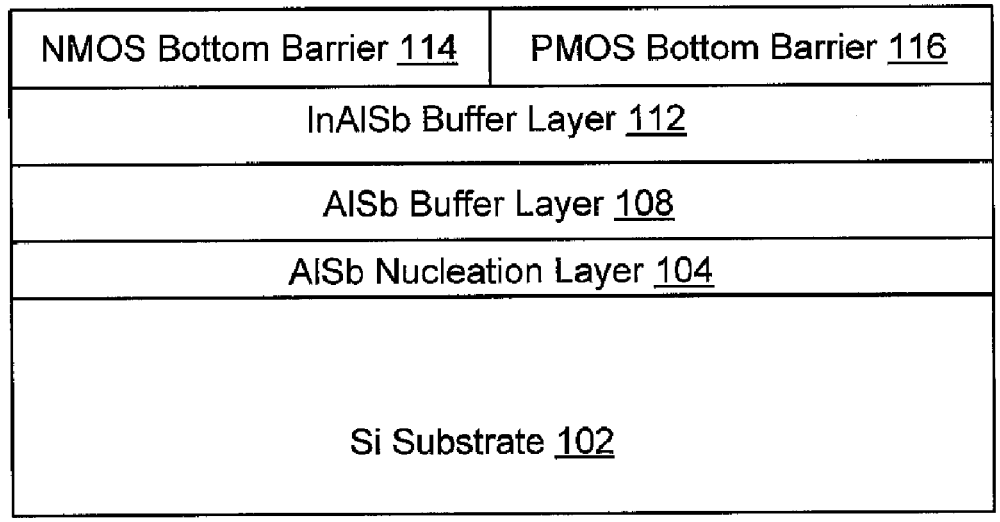
FIG. 6 is a cross-sectional side view that illustrates the NMOS and PMOS bottom barrier layers on the bottom buffer layer.

FIG. 6 is a cross-sectional side view that illustrates the NMOS and PMOS bottom barrier layers 114, 116 on the bottom buffer layer 112, according to one embodiment of the present invention. In the illustrated embodiment, the bottom barrier layers 114, 116 are separate layers 114, 116 laterally adjacent to each other. The separate NMOS and PMOS bottom barrier layers 114, 116 are formed at different times and/or from different materials. For example, the PMOS portion 170 may be masked while the NMOS bottom barrier layer 114 is formed, then the NMOS portion 160 may be masked while the PMOS bottom barrier layer 116 is formed. The NMOS bottom barrier layer 114 may comprise InAlSb, while the PMOS bottom barrier layer 116 may comprise AlGaSb.

Generally, the bottom barrier layer 114, 116 is formed of a higher band gap material than the overlying quantum well 118, 120. The bottom barrier layer 114, 116 is of sufficient thickness to provide a potential barrier to charge carriers in the transistor channel. In one embodiment, the bottom barrier 114 is InAlSb between 2 um and 5 um thick. In still other embodiments, bottom barrier layer 114, 116 is microns thick to further reduce defect density in the quantum well 118, 120. The bottom barrier 114, 116 may also be fully relaxed. In some embodiments the bottom barrier layer 114, 116 comprises between about 10% and 100% aluminum, ($Al_xIn_{1-x}Sb$, with x=0.1-1.0). In a particular embodiment, the bottom barrier layer 114, 116 is $Al_xIn_{1-x}Sb$ with 15% aluminum ($Al_{0.15}In_{0.85}Sb$).

In an alternative embodiment, PMOS portion 170 comprises a nucleation layer 104 and buffer layer 108 of GaSb, bottom barrier 116 of $Al_xGa_{1-x}Sb$ 116 and $In_xGa_{1-x}Sb$ quantum well 120. In an embodiment, PMOS portion 170 comprises nucleation layer and buffer layer of AlSb, bottom barrier of $In_xAl_{1-x}Sb$ 116 and InSb quantum well 120.

Additionally, the bottom barrier 114 for NMOS may be graded. In one embodiment, the bottom barrier 114 is substantially linearly graded from x=1.0 (AlSb) at the interface with the buffer layer 108 to x=0 (InSb) at the interface with the quantum well layer 118. In such an embodiment, the graded lower barrier layer 114 and subsequently grown InSb quantum well layer 118 may be lattice matched at their interface, and the graded bottom barrier layer 114 does not induce strain into the InSb quantum well layer 118.

In another embodiment, the NMOS bottom barrier 114 is linearly graded from x=1.0 (AlSb) at the interface with the NMOS buffer layer 108 to x=0.15 ($Al_{0.15}In_{0.85}Sb$) at the interface with the NMOS quantum well layer 118. In such an embodiment, the NMOS bottom barrier 114 induces strain in the subsequently grown NMOS quantum well layer 118. In some embodiments the NMOS bottom barrier layer 114 is graded at a rate of less than 25% Al/um. In one embodiment, the NMOS bottom barrier layer 114 is graded at a rate of 5% Al/um. Alternatively, the NMOS bottom barrier 114 may be step graded using a series of layers with decreasing aluminum concentration. In one embodiment, the NMOS lower barrier 114 is step graded in a series of decreasing 5% (x=0.05) aluminum increments.

Other materials may also be used for the bottom barrier layers 114, 116 in other embodiments. Any suitable method may be used to form the NMOS and PMOS bottom barrier layers 114, 116. The bottom barrier layers 114, 116 are between 100-500 angstroms thick in some embodiments, although other thickness may be used.

While illustrated as separate layers 114, 116 laterally adjacent to each other, these layers 114, 116 may be regions of a single blanket layer in other embodiments. Thus, in these other embodiments the NMOS and PMOS bottom barrier layers 114, 116 are substantially identical because they are formed at the same time from the same materials in both the NMOS portion 160 and PMOS portion 170. The bottom barrier layers 114, 116 may comprise $In_{1-x}Al_xSb$ (x=0.1-1.0) in such an embodiment. In a particular embodiment, the bottom barrier layers 114/116 is $Al_xIn_{1-x}Sb$ with 15% aluminum ($Al_{0.15}In_{0.85}Sb$).

FIG. 7 is a cross-sectional side view that illustrates the NMOS and PMOS quantum well channel layers 118, 120 on the bottom barrier layers 114, 116, according to one embodiment of the present invention. In the illustrated embodiment, the quantum well channel layers 118, 120 are separate layers 118, 120 laterally adjacent to each other. The separate quantum well channel layers 118, 120 are formed at different times and/or from different materials. For example, the PMOS portion 170 may be masked while the NMOS quantum well channel layer 118 is formed, then the NMOS portion 160 may be masked while the PMOS quantum well channel layer 118 is formed. The NMOS quantum well channel layers 118 may comprise InSb, while the PMOS quantum well channel layers 120 may comprise $In_xGa_{1-x}Sb$, with between about 20% and 50% In. For PMOS portion, QW channel layer 120 may be $In_xGa_{1-x}Sb$ (x=0.2-0.5) and bottom barrier layer 116 may be $Al_xGa_{1-x}Sb$ (x=0.3-1.0) in some embodiments. Other materials may also be used in other embodiments. Any suitable method may be used to form the NMOS and PMOS quantum well channel layers 118, 120. The quantum well channel layers 118, 120 are between 50-300 angstroms thick in this embodiment, although other thickness may be used.

While illustrated as separate layers 118, 120 laterally adjacent to each other, these layers 118, 120 may be regions of a single blanket layer in the other embodiments. Thus, in these embodiments the NMOS and PMOS quantum well channel layers 118, 120 may substantially identical because they are formed at the same time from the same materials in both the NMOS portion 160 and PMOS portion 170. The quantum well channel layers 118, 120 may both comprise stoichiometric InSb.

FIG. 8 is a cross-sectional side view that illustrates the NMOS and PMOS spacer layers 122, 124 on the quantum well channel layers 118, 120, according to one embodiment of the present invention. In the illustrated embodiment, the NMOS and PMOS spacer layers 122, 124 are as separate layers 122, 124 laterally adjacent to each other. The separate NMOS and PMOS spacer layers 122, 124 laterally adjacent to each other are formed at different times and/or may comprise different materials. Any suitable method may be used to form the NMOS and PMOS spacer layers 122, 124. The spacer layers 122, 124 are between 20 and 100 angstroms thick in this embodiment, although other thickness may be used. The spacer layers 122, 124 may comprise InAlSb.

Quantum well 118/120 may be of a sufficient thickness to provide adequate channel conductance. In a particular embodiment, the thickness of the quantum well 118/120 is between about 10 nm and about 50 nm. In certain embodiments quantum well layer 118/120 is below a thickness that would introduce additional defects due to lattice mismatch. The quantum well layer 118/120 may be strained by the bottom barrier layer 114/116, the spacer layer 122, 124, the top barrier layer 130/132, or any combination.

The spacer layer 122/124 may have the same material composition as the top barrier layer 130/132. In some embodiments, the spacer layer 122, 124 and the top barrier layer 130, 132 may be considered to be different portions of the same top barrier layer. They may have the same material composition and work together to perform the same functions.

While illustrated as separate layers 122, 124 laterally adjacent to each other, these layers 122, 124 may be regions of a single blanket layer in other embodiments. Thus, in these embodiments the NMOS and PMOS spacer layers 122, 124 are substantially identical because they are formed at the same time from the same materials in both the NMOS portion 160 and PMOS portion 170.

FIG. 9 is a cross-sectional side view illustrates the nucleation layer 104 through spacer layer 122, 124 as blanket layers rather than separate layers. As described above, the NMOS and PMOS portions 160, 170 may be substantially identical up through the spacer layers 122, 124 because both portions 160, 170 of each respective layer may be simultaneously formed by blanket depositions. In other embodiments, blanket depositions may be used for lower layers, while different materials for NMOS and PMOS portions 160, 170 may be begun to be used at any stage. Making the NMOS and PMOS portions 160, 170 substantially identical through the use of blanket layers further in the fabrication process may make formation of the device 100 easier, cheaper, and may reduce CTE mismatches. Device performance may be tuned by using different materials for layers on the NMOS and PMOS portions 160, 170. These factors may influence at what point in the fabrication process the NMOS and PMOS portions 160, 170 may begin to differ.

FIG. 10 is a cross-sectional side view that illustrates the NMOS and PMOS delta-doped layers 126, 128 on the spacer layers 122, 124, according to one embodiment of the present invention. The NMOS delta-doped layer 126 comprises different materials than the PMOS delta-doped layer 128. Any suitable method may be used to form the NMOS and PMOS delta-doped layers 126, 128. For example, the PMOS portion 170 may be masked while the NMOS delta-doped layer 126 is formed, then the NMOS portion 160 may be masked while the PMOS delta-doped layer 128 is formed. The NMOS delta-doped layer 126 is doped with tellurium, while the PMOS delta-doped layer 128 is doped with beryllium. In other embodiments, other dopants may be used. The delta-doped layers 126, 128 are each just one to a few monolayers thick in some embodiments, although they may have different thicknesses in other embodiments. In one embodiment the doped layer 126/128 is delta doped and has a thickness of approximately 3 Å to 5 Å. In other embodiments the doped layer 126/128 is modulation doped and has a thickness between approximately 5 Å and 50 Å.

FIG. 11 is a cross-sectional side view that illustrates the NMOS and PMOS top barrier layers 130, 132 on the delta-doped layers 126, 128, according to one embodiment of the present invention. In the illustrated embodiment, these are separate layers 130, 132 laterally adjacent to each other. They may also be deposited as a single blanket layer in other embodiments. In such embodiments the NMOS and PMOS top barrier layers 130, 132 are substantially identical because they are formed at the same time from the same materials in both the NMOS portion 160 and PMOS portion 170. Any suitable method may be used to form the NMOS and PMOS top barrier layers 130, 132. The top barrier layers 130, 132 are between 100-500 angstroms thick in this embodiment, although other thickness may be used. The top barrier layer 130/132 may have various thicknesses and in certain embodiments the top barrier layer 130/132 is between about 20 nm and 500 nm thick. The top barrier layers 130, 132 comprise InAlSb, although other materials may be used in other embodiments.

In another embodiment, the top barrier 130/132 is linearly graded from x=0.1 ($Al_{0.1}In_{0.9}Sb$) in region 122 at the interface with the quantum well layer 118/120 to x=0.4 ($Al_{0.4}In_{0.6}Sb$) at the opposite surface. In such an embodiment, the top barrier 130/132 and/or the spacer layer 122, 124 (as mentioned previously, both the spacer layers 122, 124 and top barrier layers 130, 32 may be considered part of the top barrier) may induce a strain in the quantum well layer 118/120. In a particular embodiment of PMOS portion, bottom 116 and top barrier 132 layers are $Al0.7Ga0.3Sb$ and $In_xGa_{1-x}Sb$ (x=0.2-0.5) is QW 120.

Top barrier layer 130/132 (and spacer layers 122, 124; when discussing properties of one the top barrier layer 130, 132 or spacer layers 122, 124, the description is applicable to the other one of the two layers as well) may have a larger band gap than the quantum well 118/120, thereby confining a majority of charge carriers within the quantum well 118/120 for reduced device leakage. The top barrier layer 130/132 may be formed of the same or different materials as the lower barrier layer 114/116. In some embodiments the top barrier layer 130/132 comprises between about 10% and 40% aluminum, ($Al_xIn_{1-x}Sb$, with x=0.1-0.4). At above approximately 40% aluminum, the top device layer may oxidize upon removal from the deposition chamber. In a particular embodiment, the top barrier layer 130/132 is $Al_xIn_{1-x}Sb$ with 15% aluminum ($Al_{0.15}In_{0.85}Sb$). In an alternative embodiment, the top barrier layer 130/132 may contain greater than 40% aluminum.

Additionally, the amount of strain induced in the quantum well layer 118/120 may be tailored by controlling the thickness and lattice mismatch with the lower barrier layer 114/116 and top barrier layer 130/132 or spacer layer 122, 124. In a specific embodiment, wherein the quantum well 118 is InSb and the lower barrier layer 114 and top barrier layer 130 are composed of $Al_xIn_{1-x}Sb$ with 15% aluminum, the quantum well layer 118 is compressively strained.

FIG. 12 is a cross-sectional side view that illustrates the NMOS and PMOS source/drain layers 138, 140 on the top barrier layers 130, 132, according to one embodiment of the present invention. The source/drain layers 138, 140 may be formed by blanket depositing a layer of material, then masking one of the NMOS or PMOS layers 138, 140 while appropriately doping the unmasked layer 138, 140. In another embodiment, the layers 138, 140 may be separately deposited and doped. Any suitable method may be used to form the NMOS and PMOS source/drain layers 138, 140, and any suitable materials used. In an alternative embodiment, optional etch stop layers (not shown) are used for NMOS and PMOS in order to etch selectively the top barrier for enhancement mode operation. In another embodiment, top barrier layers 130, 132 are used for source/drain contact of both NMOS and PMOS.

Figure 13:
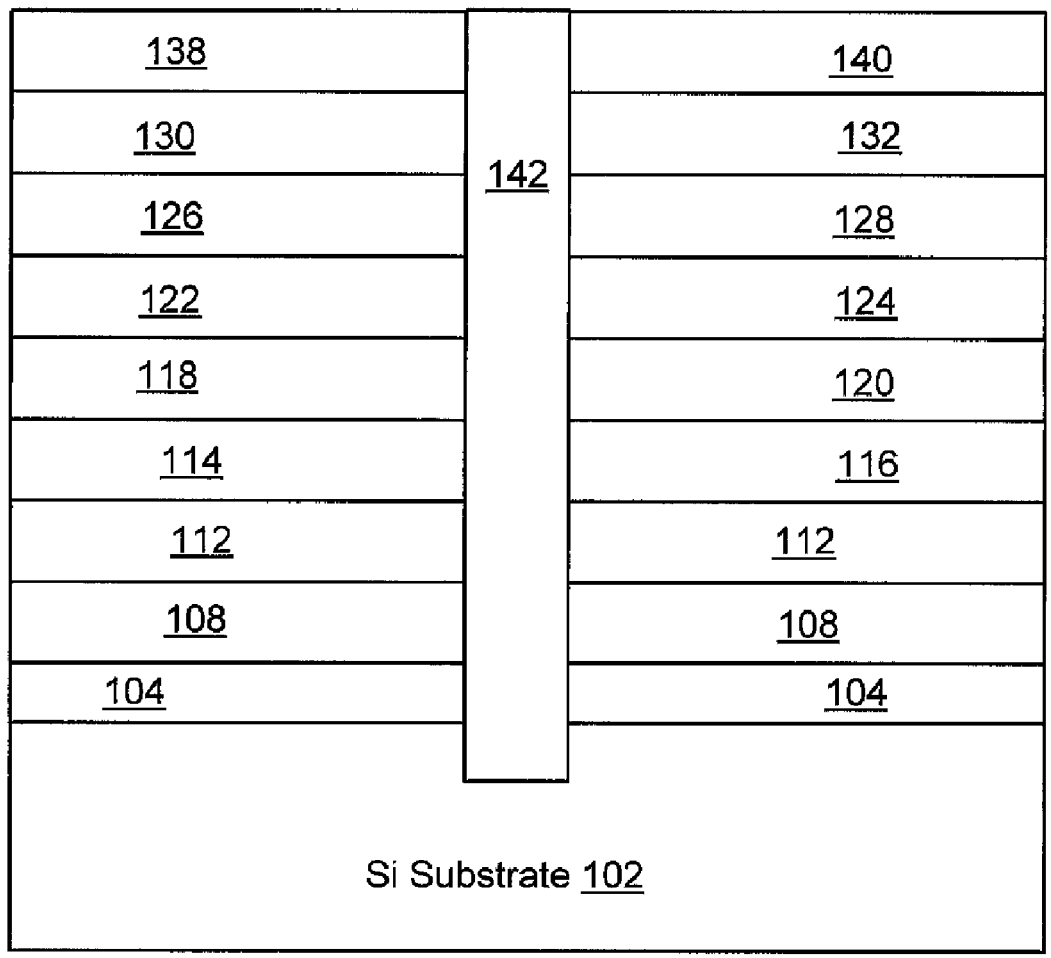
FIG. 13 is a cross-sectional side view that illustrates trench isolation formed between the NMOS and PMOS portions.

FIG. 13 is a cross-sectional side view that illustrates trench isolation 142 formed between the NMOS and PMOS portions 160, 170, according to one embodiment of the present invention. The trench isolation 142 is formed by making a trench then filling it with insulating material. In other embodiments, the trench isolation 142 may be formed differently. In the illustrated embodiment, the trench isolation 142 extends down to the substrate 102. In other embodiments, the trench isolation 142 may extend to a different depth. For example, the trench isolation 142 may only extend as far as the second buffer layer 112 in some embodiments.

Further processes may be performed to make the NMOS and PMOS devices shown in the NMOS and PMOS portions 160, 170 of FIG. 1. The gate dielectric 146, 150 and gates 144, 148 are formed. In the illustrated embodiment, the gates 144, 148 are recessed gates of transistors, so portions of the source/drain layers 138, 140 are removed to recess the gates 144, 148. In other embodiments, other types of transistors or other devices may be formed, which may lack the recesses in the source/drain layers 138, 140. The gates 144, 148 may be metal gates, with gate dielectrics 146, 150 that comprise high dielectric constant materials. Other materials may be used for the gates 144, 148 and gate dielectrics 146, 150 as well.

Figure 14:
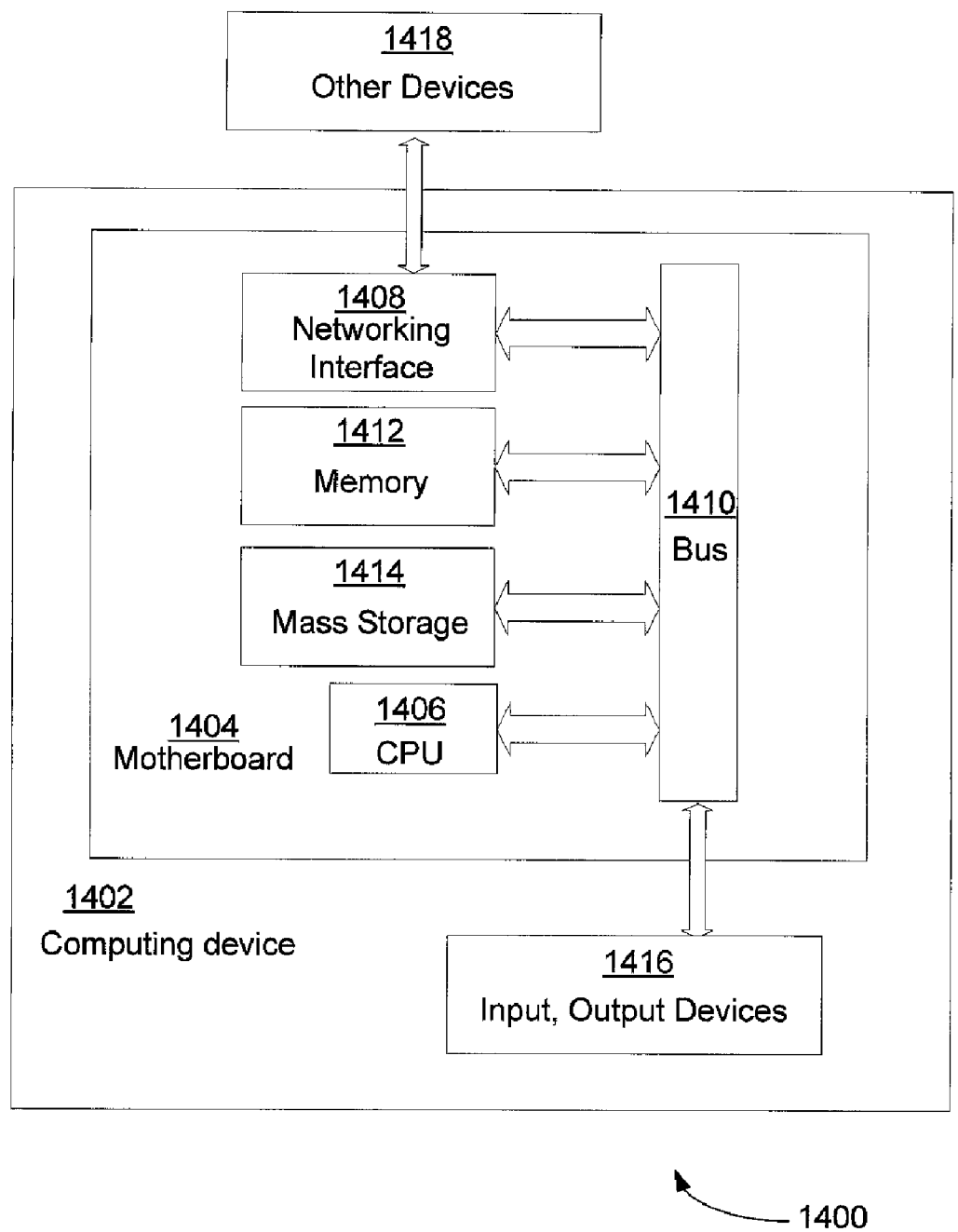
FIG. 14 illustrates a system in accordance with one embodiment of the present invention.

FIG. 14 illustrates a system 1400 in accordance with one embodiment of the present invention. One or more CMOS devices 100 may be included in the system 1400 of FIG. 14. As illustrated, for the embodiment, system 1400 includes a computing device 1402 for processing data. Computing device 1402 may include a motherboard 1404. Coupled to or part of the motherboard 1404 may be in particular a processor 1406, and a networking interface 1408 coupled to a bus 1410. A chipset may form part or all of the bus 1410.

Depending on the applications, system 1400 may include other components, including but are not limited to volatile and non-volatile memory 1412, a graphics processor (integrated with the motherboard 1404 or connected to the motherboard as a separate removable component such as an AGP or PCI-E graphics processor), a digital signal processor, a crypto processor, mass storage 1414 (such as hard disk, compact disk (CD), digital versatile disk (DVD) and so forth), input and/or output devices 1416, and so forth.

In various embodiments, system 1400 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A CMOS device with an NMOS portion and a PMOS portion, each of the NMOS portion and PMOS portion comprising:
   a nucleation layer on a substrate comprising aluminium antimonide;
   a first buffer layer on the nucleation layer comprising aluminium antimonide;
   a bottom barrier layer, the bottom barrier layer comprising aluminium indium antimonide;
   a quantum well channel on the bottom barrier layer, the quantum well channel comprising indium antimonide;
   a spacer layer on the quantum well channel; and
   a delta-doped layer on the spacer layer, the delta-doped layer in the NMOS portion comprising a different dopant than the delta-doped layer in the PMOS portion;
   a barrier layer on the delta-doped layer; and
   wherein the nucleation layer, and the buffer layer each consist of substantially the same materials in both the NMOS portion and the PMOS portion.

2. The device of claim 1, wherein each of the NMOS portion and PMOS portion comprises a bottom barrier layer on the buffer layer, the bottom barrier layer comprising indium aluminium antimonide and consisting of substantially the same materials in both the NMOS portion and the PMOS portion.

3. The device of claim 2, wherein each of the NMOS portion and PMOS portion comprises a quantum well layer on the bottom barrier layer, the quantum well layer comprising indium antimonide.

4. The device of claim 3, wherein each of the NMOS portion and PMOS portion comprises a spacer layer on the quantum well layer, the spacer layer comprising indium aluminium antimonide.

5. The device of claim 4, wherein the NMOS portion comprises an N-type delta-doped layer on the spacer layer and the PMOS portion comprises a P-type delta doped layer on the spacer layer.

6. The device of claim 5, wherein each of the NMOS portion and PMOS portion comprises a top barrier layer on the spacer layer, the top barrier layer comprising indium aluminium antimonide.

7. The device of claim 6, wherein the NMOS portion comprises an N-type source region and an N-type drain region on the top barrier layer, and the PMOS portion comprises a P-type source region and a P-type drain region on the top barrier layer and wherein each of the NMOS portion and PMOS portion comprises a gate electrode.

8. The device of claim 1, wherein the each of the NMOS portion and the PMOS comprises a bottom barrier layer on the buffer layer, the bottom barrier layer of the NMOS portion comprising indium aluminium antimonide and the bottom barrier layer of the PMOS portion comprising aluminium gallium antimonide.

9. The device of claim 1, wherein:
   each of the NMOS portion and PMOS portion comprises a bottom barrier layer on the buffer layer; and
   each of the NMOS portion and PMOS portion comprises a quantum well layer on the bottom barrier layer, the quantum well layer of the NMOS portion comprising indium antimonide and the quantum well layer of the PMOS portion comprising indium gallium antimonide.

10. The device of claim 1, wherein:
- each of the NMOS portion and PMOS portion comprises a bottom barrier layer on the buffer layer;
- each of the NMOS portion and PMOS portion comprises a quantum well layer on the bottom barrier layer;
- each of the NMOS portion and PMOS portion comprises a spacer layer on the quantum well layer; and
- the NMOS portion comprises a delta-doped layer doped with tellurium on the spacer layer and the PMOS portion comprises a delta-doped layer doped with beryllium on the spacer layer.

11. The device of claim 1, wherein the NMOS portion comprises an N-type source region and an N-type drain region, and the PMOS portion comprises a P-type source region and a P-type drain region, and wherein each of the NMOS portion and PMOS portion comprises a gate electrode.

12. A CMOS device with an NMOS portion and a PMOS portion, comprising:
- a substrate;
- a first buffer layer on the substrate, the first buffer layer comprising aluminium antimonide;
- a second buffer layer on the first buffer layer, the second buffer layer comprising indium aluminium antimonide;
- wherein the first buffer layer in the NMOS portion consists of substantially the same material as the first buffer layer in the PMOS portion, and the second buffer layer in the NMOS portion consists of substantially the same material as the second buffer layer in the PMOS portion;
- an NMOS gate, source, and drain in the NMOS portion; and
- a PMOS gate, source, and drain in the PMOS portion.

13. The device of claim 12, further comprising:
- a bottom barrier layer on the second buffer layer, the bottom barrier layer comprising indium aluminium antimonide, wherein the bottom barrier layer in the NMOS portion consists of substantially the same material as the bottom barrier layer in the PMOS portion.

14. The device of claim 13, further comprising:
- a channel layer on the bottom barrier layer, the channel layer comprising indium antimonide, wherein the channel layer in the NMOS portion consists of substantially the same material as the channel layer in the PMOS portion.

15. The device of claim 14, further comprising:
- a spacer layer on the channel layer, the spacer layer comprising indium aluminium antimonide, wherein the spacer layer in the NMOS portion consists of substantially the same material as the spacer layer in the PMOS portion.

16. The device of claim 12, further comprising a nucleation layer comprising aluminium antimonide between the substrate and the first buffer layer, wherein the nucleation layer in the NMOS portion consists of substantially the same material as the nucleation layer in the PMOS portion.

17. A CMOS device, comprising:
- an NMOS device having:
  - a first buffer layer on a substrate, source, a drain, and a gate;
  - a second buffer layer on the first buffer layer, the second buffer layer comprising indium aluminium antimonide;
  - a quantum well channel on the second buffer layer;
  - a spacer layer on the quantum well channel;
  - a delta-doped layer on the spacer layer;
  - an n-type source and drain on the delta-doped layer;
  - a gate on the delta-doped layer;
- a PMOS device having:
  - a first buffer layer on a substrate, source, a drain, and a gate;
  - a second buffer layer on the first buffer layer, the second buffer layer comprising indium and antimony;
  - a quantum well channel on the second buffer layer;
  - a spacer layer on the quantum well channel;
  - a delta-doped layer on the spacer layer;
  - a p-type source and drain on the delta-doped layer;
  - a gate on the delta-doped layer;
- wherein the first buffer layer of the NMOS device consists of substantially the same material as the first buffer layer of the PMOS device, and the second buffer layer of the NMOS device consists of substantially the same material as the second buffer layer of the PMOS device.

18. The device of claim 17, wherein the PMOS second buffer layer comprises indium aluminium antimonide.

19. The device of claim 17, wherein the PMOS second buffer layer comprises indium gallium antimonide.

20. The device of claim 17, wherein each of the NMOS and PMOS devices further comprise a bottom barrier layer between the second buffer layer and the quantum well channel, the bottom barrier layer comprises indium aluminum antimonide, and wherein the bottom barrier layer of the NMOS device consists of substantially the same material as the bottom barrier layer of the PMOS device.

21. The CMOS device of claim 17, wherein:
- the NMOS device further comprises:
  - a bottom barrier layer comprising indium aluminium antimonide between the second buffer layer and the quantum well channel;
  - a top-barrier layer comprising indium aluminium antimonide on the delta-doped layer;
- the NMOS quantum well channel comprises indium antimonide;
- the NMOS spacer layer comprises indium aluminium antimonide;
- the NMOS source, drain and gate are on the top barrier layer;
- the PMOS device further comprises:
  - a bottom barrier layer between the second buffer layer and the quantum well channel;
  - a top-barrier layer comprising aluminium gallium antimonide on the delta-doped layer;
- the PMOS second buffer layer comprises aluminium gallium antimonide;
- the PMOS quantum well channel comprises indium gallium antimonide;
- the PMOS spacer layer comprises aluminium gallium antimonide;
- the PMOS source, drain, and gate are on the top barrier layer;
- wherein the first buffer layer of the NMOS device consists of substantially the same material as the first buffer layer of the PMOS device.

22. The device of claim 21, wherein the bottom barrier layer of the NMOS device consists of a different material than the bottom barrier layer of the PMOS device.

23. The device of claim 21, wherein the second buffer layer of the NMOS device consists of a different material than the second buffer layer of the PMOS device.

24. The device of claim 17, wherein each of the NMOS and PMOS devices further comprises the a nucleation layer between the substrate and the first buffer layer, the NMOS nucleation layer consisting of substantially the same material as the PMOS nucleation layer.

25. The device of claim 17, further comprising a trench isolation region between the NMOS and PMOS devices, the trench isolation region extending from at least the source and drain to at least second buffer layer.

26. The device of claim 17, wherein the gate of each of the NMOS and PMOS devices is a recessed gate.

* * * * *